US008912932B2

(12) United States Patent  
Chen et al.

(10) Patent No.: US 8,912,932 B2  
(45) Date of Patent: Dec. 16, 2014

(54) LEMPEL-ZIV DATA COMPRESSION WITH SHORTENED HASH CHAINS BASED ON REPETITIVE PATTERNS

(71) Applicant: LSI Corporation, San Josse, CA (US)

(72) Inventors: Ning Chen, San Jose, CA (US); Robin Sik, Los Altos, CA (US)

(*) Notice: Subject to any disclaimer, the term of this patent is extended or adjusted under 35 U.S.C. 154(b) by 0 days.

(21) Appl. No.: 13/803,946

(22) Filed: Mar. 14, 2013

(65) Prior Publication Data

US 2014/0266815 A1 Sep. 18, 2014

(51) Int. Cl.  
*H03M 7/30* (2006.01)

(52) U.S. Cl.  
CPC .......... *H03M 7/3095* (2013.01); *H03M 7/3086* (2013.01)  
USPC .............................................. 341/51; 341/87

(58) Field of Classification Search  
CPC ...................................... H03M 7/3084–7/3088  
USPC ...................................... 341/51, 87  
See application file for complete search history.

(56) References Cited

U.S. PATENT DOCUMENTS

| 4,906,991 | A  | * | 3/1990 | Fiala et al. ...................... 341/51 |
| 7,548,928 | B1 | * | 6/2009 | Dean et al. ............................ 1/1 |
| 2011/0119240 | A1 | * | 5/2011 | Shapira ........................ 707/693 |
| 2012/0130965 | A1 | | 5/2012 | Oh | |

OTHER PUBLICATIONS

Ziv et al., "A Universal Algorithm for Sequential Data Compression," IEEE Transactions on Information Theory, 23(3), pp. 337-343 (May 1997).  
U.S. Appl. No. 13/659,036, "Method to Shorten Hash Chains in Lempel-Ziv Compression of Data with Repetitive Symbols," filed Oct. 24, 2012.

* cited by examiner

*Primary Examiner* — Howard Williams  
(74) *Attorney, Agent, or Firm* — Sheridan Ross P.C.

(57) ABSTRACT

Methods and apparatus are provided for Lempel-Ziv data compression with shortened hash chains based on repetitive multi-byte runs. Data is compressed by processing a sequence of data to identify a repetitive pattern, such as a multi-byte run; and providing indicators associated with the sequence of data of a start position and an end position of the repetitive pattern. The indicators of the start and end positions of the repetitive pattern may comprise, for example, flags associated with the positions. The indicators of the start and end positions of the repetitive pattern are processed to determine a sequence length of the repetitive pattern. In addition, a match can be identified in the sequence of data having a length that is greater than or equal to an offset of s bytes to identify a run comprised of an s-byte sequence.

20 Claims, 5 Drawing Sheets

10

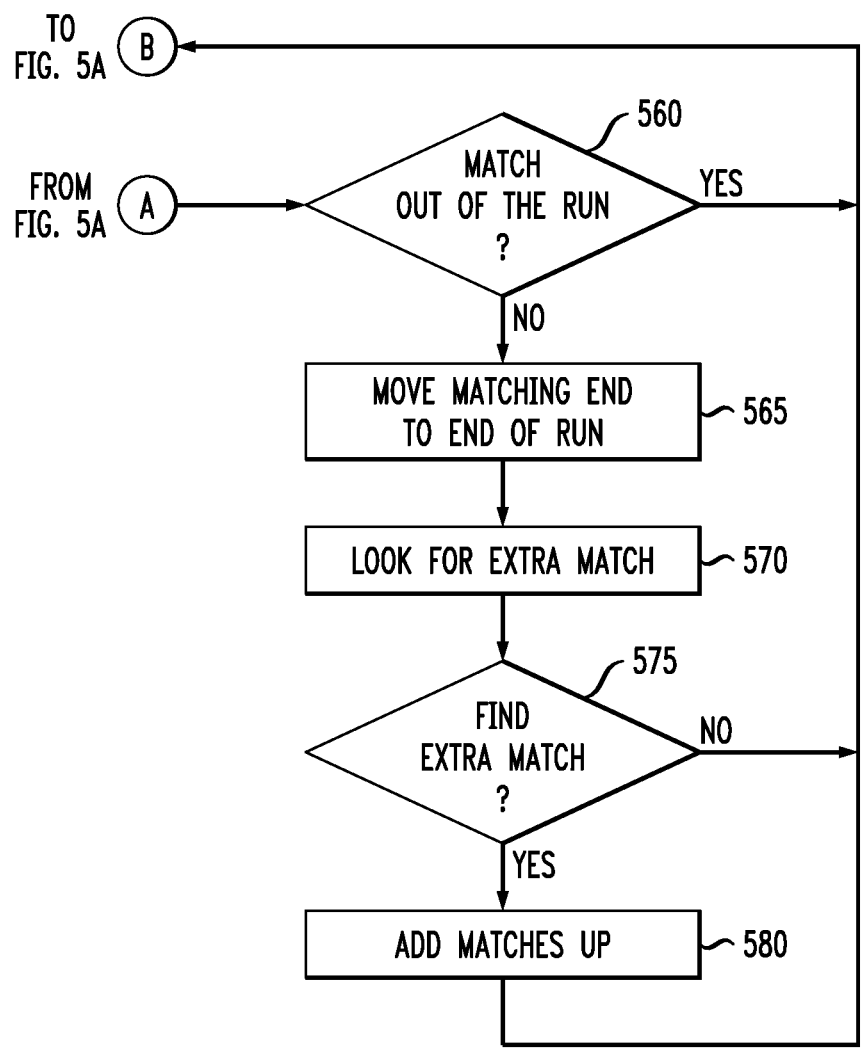

LEMPEL-ZIV DATA COMPRESSION WITH SHORTENED HASH CHAINS BASED ON REPETITIVE PATTERNS

FIELD

The present invention relates generally to hash chains and, more particularly, to methods and apparatus for shorten hash chains in Lempel-Ziv compression of data with repetitive symbols.

BACKGROUND

A Lempel-Ziv compression technique searches for recurring data patterns in a stream of bytes. See, for example, Jacob Ziv and Abraham Lempel, "A Universal Algorithm for Sequential Data Compression," IEEE Trans. on Information Theory, 23(3), 337-343 (May 1977), incorporated by reference herein. Performing the matching at all bytes of the stream, however, is time consuming. A conventional approach to improve the compression throughput uses chains of hash values. Flash chains help the compression technique process sequences with the same hash value to find potential matches.

Generally, a normal hash chain is created by setting pointers in each given hash value location to a nearest previous given hash value location. Long byte runs are known to create long hash chains having many pointers to be considered by the compression technique. U.S. patent application Ser. No. 13/659,036, filed Oct. 24, 2012, entitled "Method to Shorten Hash Chains in Lempel-Ziv Compression of Data with Repetitive Symbols," incorporated by reference herein, discloses a hash chain construction technique that shortens hash chains generated in a presence of data value runs in a stream of data values e.g., bytes or symbols), referred to as byte runs. A byte run is generally a sequence of two or more locations (or nodes) that have the same byte. The shortened hash chains generally allow a Lempel-Ziv (LZ) compression search to process through the data value runs of any length quickly by visiting only a few nodes. The shortened hash chains may also enable the LZ compression search to compare the runs by lengths, instead of through byte-by-byte comparisons. No extra storage costs may be incurred by the shortened hash chains when compared with classical hash chains.

While the disclosed byte run techniques effectively shorten hash chains, hash chains can also be shortened by addressing repetitive patterns or multi-byte runs, such as "abababab . . . " or "abcabc . . . ," which lead to long chains that cost significant search time. A need therefore exists for techniques for shortening hash chains in Lempel-Ziv compression of data with repetitive patterns.

SUMMARY

Generally, methods and apparatus are provided for Lempel-Ziv data compression with shortened hash chains based on repetitive multi-byte runs. According to one embodiment of the invention, data is compressed by processing a sequence of data to identify a repetitive pattern, such as a multi-byte run; and providing indicators associated with the sequence of data of a start position and an end position of the repetitive pattern. The indicators of the start and end positions of the repetitive pattern may comprise, for example, flags associated with the positions.

In one exemplary embodiment, the indicators of the start and end positions of the repetitive pattern are processed to determine a sequence length of the repetitive pattern. In addition, a match can be identified in the sequence of data having a length that is greater than or equal to an offset of s bytes to identify a run comprised of an s-byte sequence. A position in the sequence of data can be identified having an indicator indicating the end position of the repetitive pattern and then optionally skipping positions in the sequence of data until a position in the sequence of data is identified having an indicator indicating the start position of the repetitive pattern.

A more complete understanding of the present invention, as well as further features, aspects, embodiments and advantages of the present invention, will be obtained by reference to the following detailed description, claims and drawings.

BRIEF DESCRIPTION OF THE DRAWINGS

FIGS. 5A and 5B, collectively, are flow diagrams of an exemplary implementation of a data compression process incorporating aspects of the present invention.

DETAILED DESCRIPTION

Various aspects of the invention are directed to techniques for shortening hash chains in Lempel-Ziv compression of data with repetitive multi-byte runs.

Figure 1:
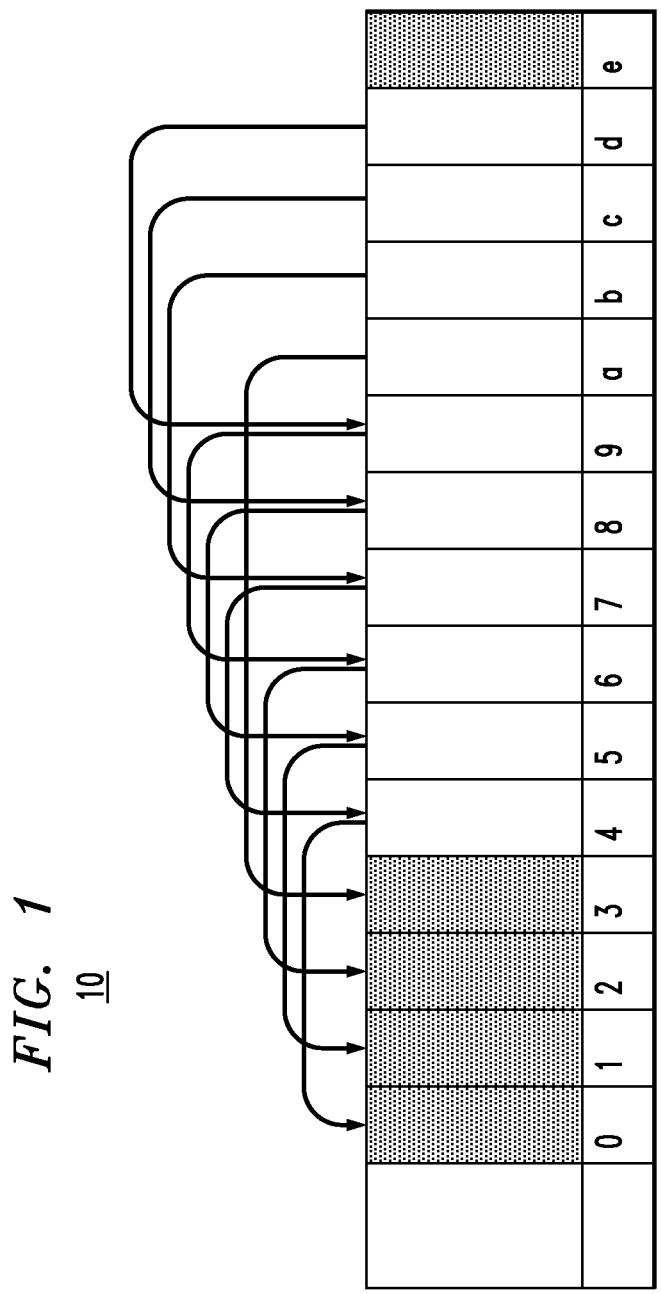
FIG. 1 illustrates a portion of a conventional hash chain with multi-byte runs.

FIG. 1 illustrates a portion of a conventional hash chain 10 with multi-byte runs. The diagram illustrates a portion of the normal hash chain 10 relative to sequential locations 0-e containing the data "eghkegheghkegho". Each location 0-3 and e contain a given hash value (shaded). As discussed further below in conjunction with Table I, locations 4-d contain different hash values (white). The normal hash chain 10 is created by setting pointers to a nearest previous given hash value location. Therefore, long byte runs create long hash chains having many pointers for the compression technique to consider.

Figure 2:
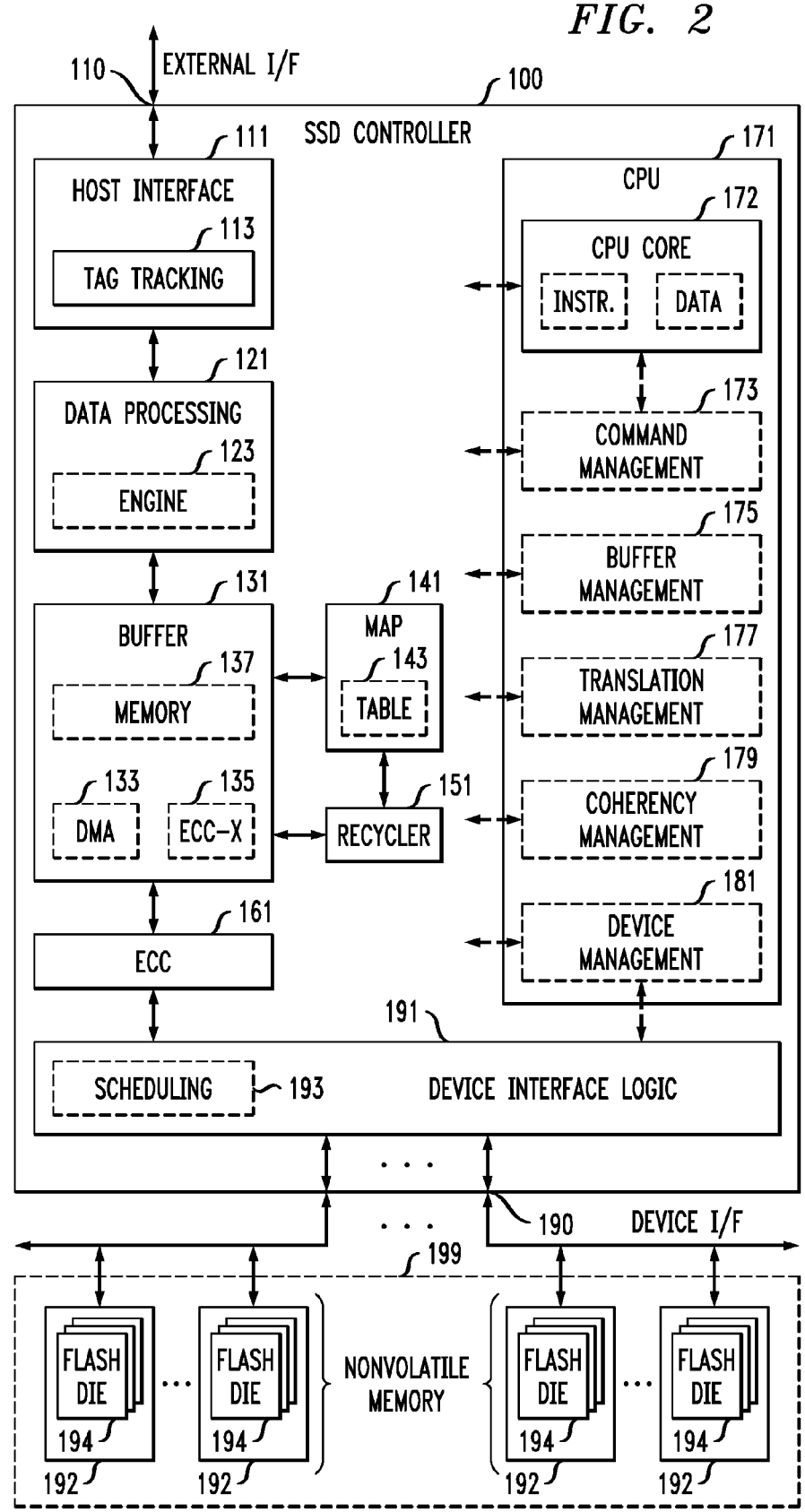
FIG. 2 is a block diagram of an exemplary implementation of an apparatus.

FIG. 2 is a block diagram of an exemplary implementation of an apparatus 100. The apparatus (or circuit, or system or integrated circuit) 100 may be implemented as a memory controller. In some embodiments of the present invention, the apparatus 100 may implement a solid state drive controller. The apparatus 100 generally controls a block (or circuit) 199. The circuit 199 may implement a nonvolatile memory circuit. In some embodiments, the circuit 199 may implement a solid state drive memory circuit. The circuits 100-199 may represent modules and/or blocks that may be implemented as hardware, software, a combination of hardware and software, or other implementations.

The circuit 100 may be communicatively coupled via one or more external interface (or ports) 110 to a host (e.g., a computer). The interfaces 110 may be implemented as one or more of: a serial AT attachment (e.g. SATA) interface; a serial attached small computer system interface (e.g., SAS) interface; a peripheral component interconnect express (e.g., PCIe) interface; a Fibre Channel interface; an Ethernet Interface (such as Gigabit Ethernet); a non-standard version of any of the preceding interfaces; a custom interface; or any other type of interface used to interconnect storage and/or communications and/or computing devices.

The circuit 100 may also be communicatively coupled via one or more device interfaces (or ports) 190 to the circuit 199. The circuit 199 generally includes one or more storage devices, such as one or more of flash device blocks (or circuits) 192. The interfaces 190 may be implemented as one or more of: an asynchronous interface; a synchronous interface; a single data rate (e.g., SDR) interface; a double data rate (e.g., DDR) interface; a dynamic random access memory (e.g., DRAM) compatible DDR or DDR2 synchronous interface; an open NAND flash interface (e.g., ONFI) compatible interface, such as an ONFI 2.2 or ONFI 3.0 compatible interface; a toggle-mode compatible flash interface; a non-standard version of any of the preceding interfaces; a custom interface; or any other type of interface used to connect to storage devices.

Each circuit 192 generally includes one or more individual flash die (or circuits) 194. Multiple circuits 194 may be optionally and/or selectively accessible in parallel. The circuit 192 may be configured to couple to circuit 100 communicatively. Any type of storage device may be implemented in the circuit 192, such as a single-level cell (e.g., SLC) NAND flash memory, a multi-level cell (e.g., MLC) NAND flash memory, a NOR flash memory, flash memory using polysilicon or silicon nitride technology-based charge storage cells, two-dimensional or three-dimensional technology-based flash memory, read-only memory (e.g., ROM), static random access memory (e.g., SRAM), dynamic random access memory (e.g., DRAM), ferromagnetic memory, phase-change memory, racetrack memory, resistive RAM (e.g., ReRAM), or any other type of memory device or storage medium.

The interfaces 190 are generally organized as: one or more busses with one or more of the circuits 192 per bus; one or more groups of busses with one or more of the circuits 192 per bus, where busses in a group are generally accessed in parallel; or any other organization of one or more of circuits 192 onto the interfaces 190.

The circuit 100 generally includes one or more blocks, such as host interface blocks (or circuits) 111, data processing blocks (or circuits) 121, a buffer block (or circuit) 131, a map block (or circuit) 141, a recycler block (or circuit) 151, an error correction code (e.g., ECC) block (or circuit) 161, a device interface logic block (or circuit) 191, and a central processing unit (e.g., CPU) block (or circuit) 171.

The circuits 111 generally send and receive commands and/or data via the interfaces 110, and may track progress of individual commands via a tag tracking block (or circuit) 113. The commands may include a read command specifying an address (such as a logical block address (e.g., LBA)) and an amount of data (such as a number of LBA quanta or sectors) to read. In response to the read command, the circuit 100 may provide read status and/or read data. The commands may also include a write command specifying an address (such as an LBA) and an amount of data (such as a number of LBA quanta or sectors) to write. In response to the write command, the circuit 100 generally provides a write status and/or requests write data and optionally subsequently provides write status. The commands may include a de-allocating command (e.g., a trim command) specifying one or more addresses (such as one or more LBAs) that should no longer be allocated. In response to the de-allocating command, the circuit 100 may modify the map accordingly and optionally provides a de-allocating status.

The circuit 121 may optionally and/or selectively process some or all of the data sent between the circuit 131 and the interfaces 110. The circuit 121 may optionally and/or selectively process data stored in the circuit 131. The circuit 121 generally uses one or more engine blocks (or circuits) 123 to perform one or more of: formatting; reformatting; transcoding; and any other data processing and/or manipulation task.

The circuit 131 may store data sent to/from interfaces 110 and from/to the interfaces 190. The circuit 131 may additionally store system data, such as some or all map tables, used by the circuit 100 to manage one or more of the circuits 192. The circuit 131 generally includes one or more of: a memory block (or circuit) 137 used for temporary storage of data; a direct memory access (e.g., DMA) block (or circuit) 133 used to control movement of data to and/or from circuit 131; and an ECC-X block (or circuit) 135 used to provide higher-level error correction and/or redundancy functions; and other data movement and/or manipulation functions.

The circuit 161 may optionally and/or selectively process some or all data sent between the circuit 131 and interfaces 190. The circuit 161 may optionally and/or selectively processes data stored in the circuit 131. The circuit 161 may be configured to provide lower-level error correction and/or redundancy functions, such as in accordance with one or more ECC techniques. The circuit 161 may implement one or more of: a cyclic redundancy check (e.g., CRC) code; a Hamming code; an Reed-Solomon (e.g., RS) code; a Bose, Ray-Chaudhuri and Hocquenghem (e.g., BCH) code; an low density parity check (e.g., LDPC) code; a Viterbi code; a trellis code; a hard-decision code; a soft-decision code; an erasure-based code; any error detecting and/or correcting code; and any combination of the preceding. The circuit 161 may include one or more decoders, such as low density parity check decoders.

The circuit 191 generally controls instances of the circuit 192 via the interfaces 190. The circuit 191 may be configured to send data to/from the instances of the circuit 192 according to a protocol of the circuit 192. The circuit 191 generally includes a scheduling block (or circuit) 193 to selectively sequence control of the instances of the circuit 192 via the interfaces 190. The circuit 193 may be configured to queue operations to the instances of the circuit 192, and to selectively send the operations to the individual instances of circuit 192 (or circuit 194) when available.

The circuit 141 may be configured to convert between data addressing used on the interfaces 110 and data addressing used on the interfaces 190, using a table block (or circuit) 143 to map external data addresses to locations in the circuit 199. The circuit 141 may convert LBAs used on the interfaces 110 to block and/or page addresses targeting one or more of the circuits 194, via mapping provided by the table 143. For LBAs that have never been written since drive manufacture or de-allocation, the circuit 141 generally points to a default value to return if the LBAs are read. For example, when processing a de-allocating command, the circuit 141 may be modified so that entries corresponding to the de-allocated LBAs point to a default value. Various default values may be implemented, each having a corresponding pointer. The default values generally enable reading some de-allocated LBAs (such as in an initial range) as a particular default value, while reading other de-allocated LBAs (such as in a subsequent range) as another default value. The default values may be defined by flash memory, hardware, firmware, command and/or primitive arguments and/or parameters, programmable registers, or various combinations thereof.

The circuit 141 is generally configured to use the table 143 to perform and/or to look up translations between addresses used on the interfaces 110 and data addressing used on the interfaces 190. The table 143 may be implemented as one or more of: a one-level map; a two-level map; a multi-level map; a map cache; a compressed map; any type of mapping from one address space to another; and any combination of the foregoing. The table 143 generally includes one or more of: static random access memory; dynamic random access memory; nonvolatile memory (such as flash memory); cache memory; on-chip memory; off-chip memory; and any combination of the foregoing.

In some embodiments, the circuit 151 generally performs garbage collection. For example, instances of the circuit 192 may contain blocks that should be erased before the blocks are re-writeable. The circuit 151 may be configured to determine which portions of the instances of the circuit 192 are actively in use (e.g., allocated instead of de-allocated), such as by scanning a map maintained by the circuit 141, and to make unused (e.g., de-allocated) portions of the instances of circuit 192 available for writing by erasing the portions. The circuit 151 may also be configured to move data stored within instances of circuit 192 to make larger contiguous portions of the instances of circuit 192 available for writing.

The circuit 192 may be configured to selectively and/or dynamically configured, managed, and/or used to have one or more bands for storing data of different types and/or properties. A number, arrangement, size, and type of the bands may be dynamically changeable. For example, data from a computing host may be written into a hot (e.g., active) band, while data from the circuit 151 may be written into a cold (e.g., less active) band. In some usage scenarios, if the computing host writes a long sequential stream, a size of the hot band may grow, whereas if the computing host does random writes or few writes, a size of the cold band may grow.

The circuit 171 may be configured to control various portions of the circuit 100. The circuit 171 generally includes a CPU core block (or circuit) 172. The circuit 172 may be implemented as one or more single-core and/or multi-core processors. Some or all of the individual processors cores in the circuit 172 may be multi-threaded. The circuit 172 generally includes instruction and/or data caches and/or memories. For example, the instruction memory may contain instructions to enable the circuit 172 to execute programs (e.g., program instructions, software and/or firmware) to control the circuit 100. Some or all of the instructions executed by the circuit 172 may be stored on instances of circuit 192.

The circuit 171 may include a command management block (or circuit) 173 to track and control commands received via interfaces 110 while the commands are in progress; a buffer management block (or circuit) 175 to control allocation and use of the circuit 131; a translation management block (or circuit) 177 to control the circuit 141; a coherency management block (or circuit) 179 to control consistency of data addressing and to avoid conflicts such as between external data accesses and recycle data accesses; a device management block (or circuit) 181 to control the circuit 191; an identity management block (or circuit) 182 to control modification and communication of identify information, and optionally other management units.

The circuit 171 is generally configured to perform other management tasks, such as one or more of: gathering and/or reporting performance statistics; controlling power sequencing, controlling and/or monitoring and/or adjusting power consumption; responding to power failures; controlling and/ or monitoring and/or adjusting clock rates; and other management tasks.

The host may include one or more of a computer, a workstation computer, a server computer, a storage server, a storage area network (e.g., SAN), a network area storage (e.g., NAS) device, a direct-attached storage (e.g., DAS) device, a storage appliance, a personal computer, a laptop computer, a notebook computer, a netbook computer, a tablet device or computer, an ultrabook computer, an electronic reading device (such as an e-reader), a personal digital assistant, a navigation system, a (handheld) global positioning satellite receiver device, an automotive control system, an automotive media control system or computer, a printer, copier or fax machine or all-in-one device, a point of sale (e.g., POS) device, a cash register, a media player, a television, a media recorder, a digital video recorder, a digital camera, a cellular handset, a cordless telephone handset, and an electronic game.

The circuit 100 may be implemented on a single integrated circuit (e.g., IC), a single die of a multi-die IC, a plurality of die of a multi-die IC, or a plurality of ICs. For example, the circuit 131 may be implemented on a same die as other elements of the circuit 100. For another example, the circuit 131 may be implemented on a different die than other elements of the circuit 100. Additional details of the circuit 100 and the circuit 199 may be found in co-pending U.S. application Ser. No. 13/464,433, which is hereby incorporated by reference in its entirety.

Figure 3:
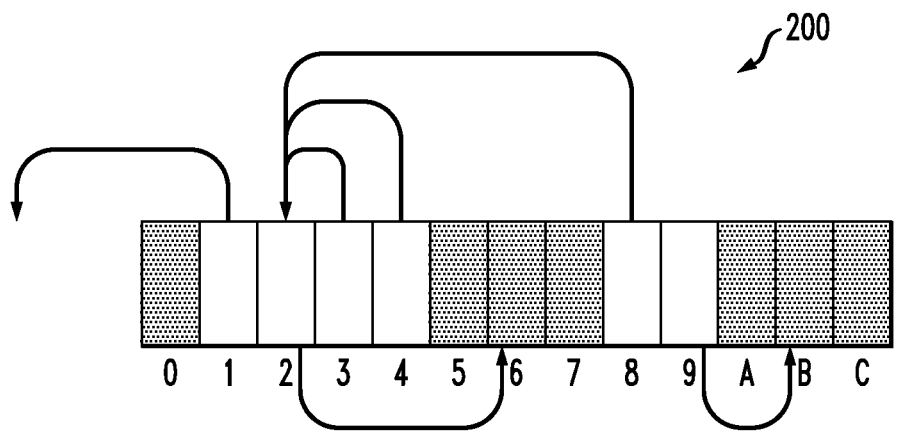
FIG. 3 is a diagram of a portion of a shortened hash chain in accordance with the techniques of U.S. patent application Ser. No. 13/659,036.

FIG. 3 is a diagram of a portion of a shortened hash chain 200 in accordance with the techniques of U.S. patent application Ser. No. 13/659,036, filed Oct. 24, 2012, entitled "Method to Shorten Hash Chains in Lempel-Ziv Compression of Data with Repetitive Symbols,". The shortened hash chain 200 may run across multiple sequential locations (e.g., locations 0-C). Each location 0-C may correspond to a respective hash value for multiple (e.g., 2 to 8) data values and a respective pointer (or chain value). Each pointer may either (i) point to another location having the same hash value or (ii) contain a default value (e.g., a zero value pointer).

As discussed above, the disclosed hash chain construction techniques shorten hash chains generated in a presence of data value runs in a stream of data values (e.g., bytes or symbols). A run is generally a sequence of two or more locations (or nodes) that have the same value. The hash chain construction technique may group consecutive identical (or common) data values into a single node. Branches may be added to the chain by the technique when grouping. Therefore, the shortened hash chain may be considered a tree. Tracing into a run generally uses only a single node of a second data value (or a second byte or symbol). Tracing out of the run may use another node of an initial data value (or an initial byte or symbol). A pointer (or chain value) of the second node may point forward and may be the only type of pointer to point forward. In classical hash chains, all pointers point backward. Therefore, the pointer of the second node generally provides multiple (e.g., three) pieces of information: that the node is the second data value of a run; a length of the run; and an implicit pointer to an initial (or first) node of the run.

Figure 4:
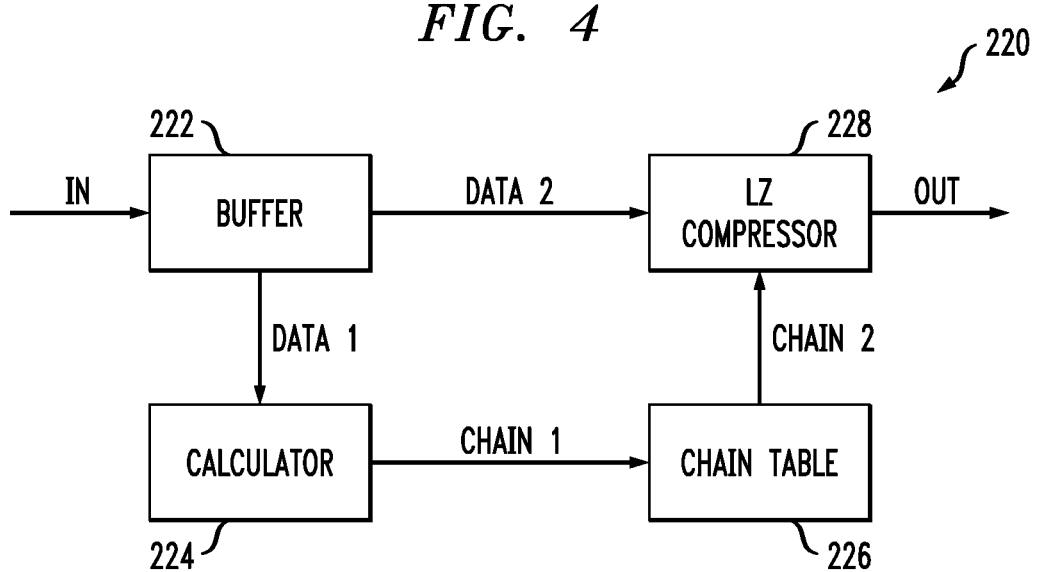
FIG. 4 is a block diagram of an example implementation of an apparatus in accordance with an embodiment of the present invention.

FIG. 4 is a block diagram of an example implementation of an apparatus 220 in accordance with an embodiment of the present invention. The apparatus (or circuit, or system, or integrated circuit) 220 may be implemented within the circuit 100. The apparatus 220 generally comprises a block (or circuit) 222, a block (or circuit) 224, a block (or circuit) 226 and a block (or circuit) 228. The circuits 222-228 may represent modules and/or blocks that may be implemented as hardware, software, a combination of hardware and software, or other implementations. In some embodiments, the circuits 222-228 may be implemented as the circuits 121, 131 and/or 171.

A signal (e.g., IN) may be received by the circuit 222. The signal IN generally conveys a stream of data values having repetitive symbols. The circuit 222 may generate and present a signal (e.g., DATA1) to the circuit 224. A signal (e.g., DATA2) may, also be generated by the circuit 222 and presented to the circuit 228. Each signal DATA1 and DATA2 may carry copies of the data values. The circuit 224 may generate and present a signal (e.g., CHAIN1) to the circuit 226. A signal (e.g., CHAIN2) may be generated by the circuit 226 and transferred to the circuit 228. Each signal CHAIN1 and CHAIN2 may carry pointers of a shorted hash chain.

The circuit 222 may implement a buffer circuit. The circuit 222 is generally operational to temporarily store the data values received in the signal IN. A copy of the data values may be presented in the signal DATA1 from the circuit 222 to the circuit 224. Another copy of the data values may be presented in the signal DATA2 from the circuit 222 to the circuit 228 in the signal DATA2.

The circuit 224 may implement a calculator circuit. The circuit 224 is generally operational to (i) generate a sequence of hash values, (ii) find consecutive multi-byte hash values, and (iii) create a shorted hash chain by generating one or more pointers. The hash values may be generated from the stream of data values received in the signal DATA1. The hash values may be stored in a table (e.g., stored in the circuit 226). Each hash value may be calculated from multiple (e.g., two or more) data values. The resulting hash values may be transferred in the signal CHAIN1 to the circuit 226. If two consecutive multi-byte hash values are found, a run of at least three consecutive same (repeated) multi-byte data values generally exists in the signal IN. Therefore, a pointer may be generated in the circuit 222 at an intermediate (or second) location in the table that corresponds to a second of the consecutive multi-byte hash values (and the second of the consecutive multi-byte same data values). The pointer may point forward in the table to an end location that corresponds to a last of the same multi-byte data values in the data value run. In some embodiments, the circuit 224 may compare the consecutive data values (e.g., a byte-to-byte comparison) to ensure that a run of common multi-byte data values exist in the signal DATA1.

The circuit 224 may be further operational to examine additional hash values in the run, if any. If a third consecutive common multi-byte hash value is found, an additional pointer may be set in the table at an additional location corresponding to the third consecutive common multi-byte hash value (and the third consecutive multi-byte same data value). The additional pointer may point backward in the table to the intermediate location. The circuit 224 may continue examining more hash values and setting more pointers in the run backward to the intermediate location. The pointers may be transferred to the circuit 226 in the signal CHAIN1. When the end location of the last same multi-byte data value is reached, the run may be considered at an end.

The circuit 226 may implement a chain table memory circuit. The circuit 226 is generally operational to store hash values and pointers of a shortened chain table created by the circuit 224. The pointers may be presented in the signal CHAIN2 from the circuit 226 to the circuit 228.

The circuit 228 may implement a compressor circuit. The circuit 228 is generally operational to compress the data values received in the signal DATA2 using the pointers received in the signal CHAIN2. The compressed information may be presented in the signal OUT. In some embodiments, the compression may be a LZ compression. Other compression techniques may be implemented to meet the criteria of a particular application.

Multi-Byte Runs

As previously indicated, aspects of the invention are directed to techniques for shortening hash chains in Lempel-Ziv compression of data with repetitive multi-byte runs, such as as "abababab . . . " or "abcabc . . . ". Generally, as discussed further below, for a match having length that is at least the offset s, then the match is a run of an s-byte sequence. If a minimal match length is set to 3 bytes, two-byte runs like ababc that repeat only once are not detected. Time is saved by performing matching only once for all nodes in the run.

In one exemplary implementation, a flag array is employed to store flags related to the multi-byte run processing. For example, the following exemplary flag assignments are employed in an exemplary embodiment:

Flag 0: not a multi-byte run;
Flag 1: bytes of the first sequence leading a run;
Flag 2: bytes of the intervening sequence before the last sequence; and
Flag 3: bytes of the last sequence in the run.

Thus, all positions of Flag 1 and Flag 3 are paired up and identify the start and end of a multi-byte run, respectively.

Table I provides an example of a shortened hash chain table and a hash chain table based on a stream of data values, as well as the corresponding multi-byte run flags, as follows (where a hash of n indicates a null pointer):

TABLE I

| | Pos'n | | | | | | | | | | | | | | | | | | |
|---|---|---|---|---|---|---|---|---|---|---|---|---|---|---|---|---|---|---|---|
| | 0 | 1 | 2 | 3 | 4 | 5 | 6 | 7 | 8 | 9 | a | b | c | d | e | ... | w | x | Z |
| Data | e | g | h | k | e | g | h | e | g | h | k | e | g | h | o | ... | e | g | h | O |
| Hash | n | n | n | n | 0 | 1 | 2 | 4 | 5 | 6 | 3 | 7 | 8 | 9 | n | ... | b | c | d | E |
| Flags | 1 | 1 | 1 | 1 | 1 | 0 | 0 | 3 | 3 | 3 | 3 | 3 | 0 | 0 | 0 | ... | | | | |

Figure 5A:
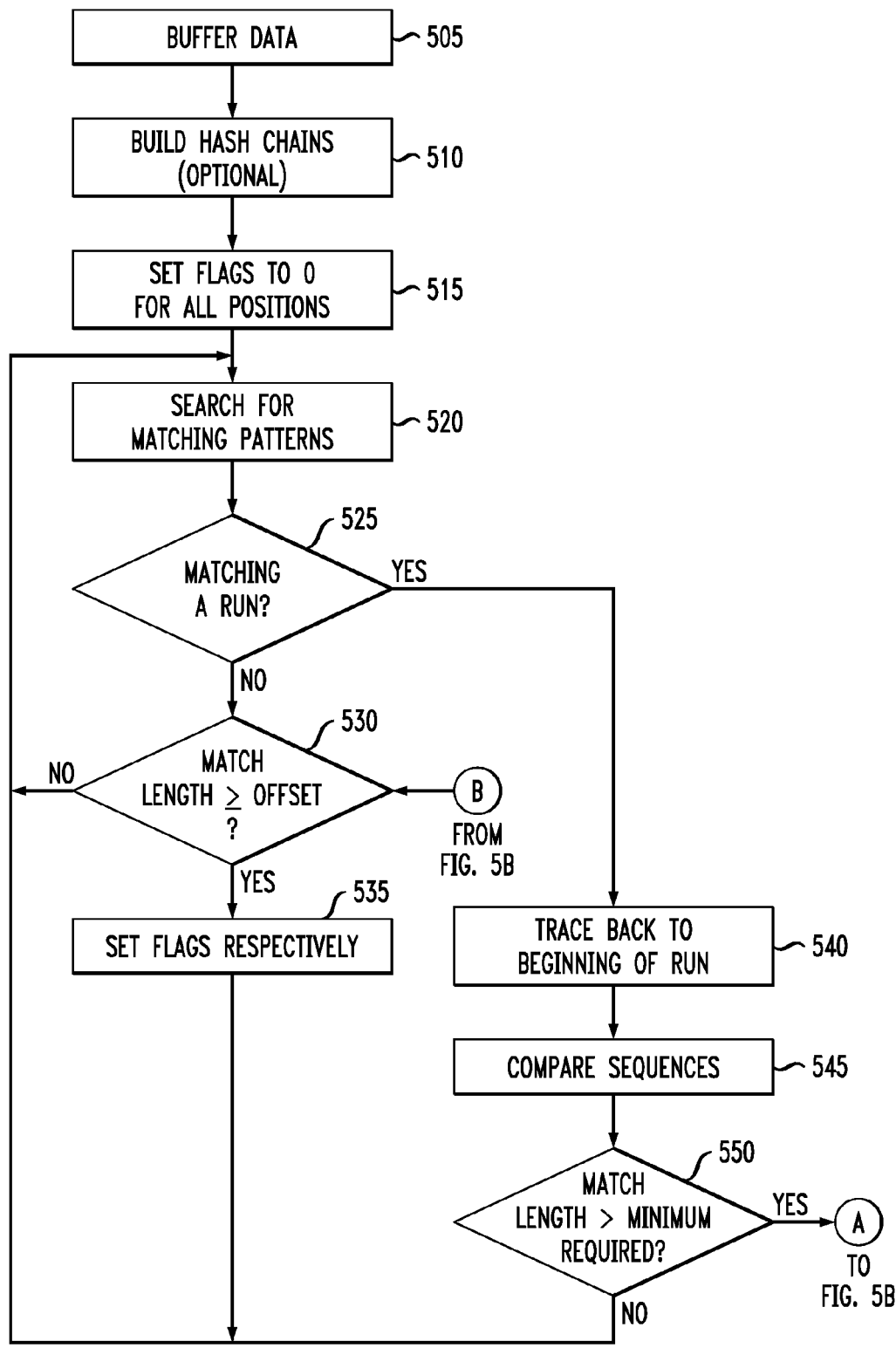

FIGS. 5A and 5B, collectively, are flow diagrams of an exemplary implementation of a data compression process 500 incorporating aspects of the present invention. Generally, the data compression process 500 processes the data stream and associated data from Table I and when a pointer is encountered having a flag equal to 3, the data compression process 500 skips the pointer and goes up the chain until a flag equal to 1 is encountered. The sequence length (distance between pointer of flag 3 and pointer of flag 2 (or flag 1 if there are no pointers of flag 2)) is identified. The exemplary data compression process 500 performs regular matching, starting with pointer of flag 1, to search for patterns that occurred before.

As shown in FIG. 5A, the exemplary data compression process 500 initially buffers the data during step 505 and optionally builds the hash chains during step 510. The Flags are all initially set to 0 for all positions during step 515. The data compression process 500 searches for matching patterns during step 520.

A test is performed during step 525 to determine if the pattern matches a run. If it is determined during step 525 that the match is not a run (e.g., a match but the flag is not set to 3), then a further test is performed during step 530 to determine if the match length is greater than or equal to the defined offset (i.e., whether this sequence is another run). If it is determined during step 530 that the match length is not greater than or equal to the defined offset, program control returns directly to step 520 (incrementing one bit position past the current pattern). If it is determined during step 530 that the match length is greater than or equal to the defined offset, then the flags are set respectively during step 535 for the newly identified multi-byte run. For example, the flag for the first sequence leading the run is set to 1 and the flag for the bytes of the last sequence in the run is set to 3. Intervening bytes can be set to 2.

If, however, it is determined during step 525 that the match is a run, then the data compression process 500 traces back to the beginning of the run during step 540. The sequences are compared during step 545.

When the matching stops, the data compression process 500 checks the match length (Step 550). If it is determined during step 550 that the match length is not bigger than the minimum required, then program control returns to step 520.

If it is determined during step 550 that the match length is bigger than the minimum required, then program control proceeds to FIG. 5B, where a further test is performed during step 560 to determine if the match reaches out of the run. If it is determined during step 560 that the match reaches out of the run, then program control returns to FIG. 5A, step 530 to finish matching on the whole run.

If, however, it is determined during step 560 that the match does not reach out of the run, then the data compression process 500 updates the offset during steps 565-580 so that the matching end falls on a position with flag 3 (i.e., to end of the run) during step 565, and continues to extend the matching outside the run to find longer matches.

The data compression process 500 looks for an additional match during step 570. A test is performed during step 575 to determine if an extra match is found. If it is determined during step 575 that an extra match is not found, then program control returns to FIG. 5A, step 530. If, however, it is determined during step 575 that an extra match is found, then the matches are added up during step 580. The matching length is the sum of matching inside the run and outside the run.

For the exemplary data in Table I, the data compression process 500 initially finds a match of offset 7 and length 7 at position 7. In other words, the data in positions 7-d matches the data in positions 0-6.

When the data compression process 500 starts searching backward at position w, and goes back to position b (which has a match sequence), which is first position with a flag=3 indicating the end of a run. The data compression process 500 continues to position 7, which also has flag=3 and then continues to position 4, which is the next position with a flag=1; so the sequence length is given by b−4=7 (difference between end and start positions of data sequence "egheghk").

The exemplary data compression process 500 then compares between positions 4 and w, and finds a copy of offset w−4, length 3. The exemplary data compression process 500 goes forward by 7, reaching b which has flag 3, extending the comparison on z and e and finding another matching byte, so the copy becomes w−b, length 4. The exemplary data compression process 500 continues to position 0, which has flag=1; so the sequence length is given by 7−0=7 and providing a copy of length 3. The exemplary data compression process 500 goes forward by 7, reaching 7 which has a flag=3 and finding no further match.

In a further variation, the following additional information can be included in Table I: first pointer, last pointer and sequence length to save additional time on tracing the hash chain.

The functions described herein may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally executed from a medium or several media by one or more of the processors of the machine implementation.

The present invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

Process, System and Article of Manufacture Details

While a number of flow charts herein describe an exemplary sequence of steps, it is also an embodiment of the present invention that the sequence may be varied. Various permutations of the algorithm are contemplated as alternate embodiments of the invention. While exemplary embodiments of the present invention have been described with respect to processing steps in a software program, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit, micro-controller, or general-purpose computer. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital signal processor, a microprocessor, and a micro-controller.

As is known in the art, the methods and apparatus discussed herein may be distributed as an article of manufacture that itself comprises a computer readable medium having computer readable code means embodied thereon. The computer readable program code means is operable, in conjunction with a computer system, to carry out all or some of the steps to perform the methods or create the apparatuses discussed herein. The computer readable medium may be a tangible recordable medium (e.g., floppy disks, hard drives, compact disks, memory cards, semiconductor devices, chips, application specific integrated circuits (ASICs)) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk.

The computer systems and servers described herein each contain a memory that will configure associated processors to implement the methods, steps, and functions disclosed herein. The memories could be distributed or local and the processors could be distributed or singular. The memories could be implemented as an electrical, magnetic or optical memory, or any combination of these or other types of storage devices. Moreover, the term "memory" should be construed broadly enough to encompass any information able to be read from or written to an address in the addressable space accessed by an associated processor. With this definition, information on a network is still within a memory because the associated processor can retrieve the information from the network.

It is to be understood that the embodiments and variations shown and described herein are merely illustrative of the principles of this invention and that various modifications may be implemented by those skilled in the art without departing from the scope and spirit of the invention.

We claim:

1. A method for compressing data, comprising the steps of:
processing a sequence of data to identify a repetitive pattern in said sequence of: data; and
providing indicators associated with said sequence of data of a start position and an end position of said repetitive pattern.

2. The method of claim 1, wherein said indicators of said start and end positions of said repetitive pattern comprise flags associated with said positions.

3. The method of claim 2, wherein said flags comprise two bit values.

4. The method of claim 1, further comprising the step of processing said indicators of said start and end positions of said repetitive pattern to determine a sequence length of said repetitive pattern.

5. The method of claim 1, wherein said repetitive pattern comprises a multi-byte run.

6. The method of claim 1, further comprising the step of identifying a match in said sequence of data having a length that is greater than or equal to an offset of s bytes to identify a run comprised of an s-byte sequence.

7. The method of claim 1, further comprising the step of identifying a position in said sequence of data having an indicator indicating said end position of said repetitive pattern and skipping positions in said sequence of data until a position in said sequence of data is identified having an indicator indicating said start position of said repetitive pattern.

8. The method of claim 1, further comprising the step of finishing a matching on a whole run when the match length exceeds a minimum and the match reaches out of the run.

9. The method of claim 1, further comprising the steps of updating an offset so the matching end falls on a position with an indicator of an end position of said repetitive pattern and extending the match outside the run, when the match length exceeds a minimum and the match does not reach out of the run.

10. A tangible machine-readable recordable storage medium for compressing, data, wherein one or more software programs when executed by one or more processing devices implement the steps of the method of claim 1.

11. A system for compressing data, comprising:
a memory; and
at least one hardware device, coupled to the memory, operative to:
process a sequence of data to identify a repetitive pattern in said sequence of data; and
provide indicators associated with said sequence of data of a start position and an end position of said repetitive patterns.

12. The system of claim 11, wherein said indicators of said start and end positions of said repetitive pattern comprise flags associated with said positions.

13. The system of claim 12, wherein said flags comprise two bit values.

14. The system of claim 11, wherein said at least one hardware device is further configured to process said indicators of said start and end positions of said repetitive pattern to determine a sequence length of said repetitive pattern.

15. The system of claim 11, wherein said repetitive pattern comprises a multi-byte run.

16. The system of claim 11, wherein said at least one hardware device is further configured to identify a match in said sequence of data having a length that is greater than or equal to an offset of s bytes to identify a run comprised of an s-byte sequence.

17. The system of claim 11, wherein said at least one hardware device is further configured to identify a position in said sequence of data having an indicator indicating said end position of said repetitive pattern and skip positions in said sequence of data until a position in said sequence of data is identified having an indicator indicating said start position of said repetitive pattern.

18. The system of claim 11, wherein said at least one hardware device is further configured to finish a matching on a whole run when the match length exceeds a minimum and the match reaches out of the run.

19. The system of claim 11, wherein said at least one hardware device is further configured to update an offset so the matching end falls on a position with an indicator of an end position of said repetitive pattern and extend the match outside the run, when the match length exceeds a minimum and the match does not reach out of the run.

20. The system of claim 11, wherein said compression comprises a Lempel-Ziv compression.

* * * * *